United States Patent [19]

Stoppels et al.

[11] Patent Number: 4,594,628
[45] Date of Patent: Jun. 10, 1986

[54] MAGNETIC HEAD HAVING COBALT-CONTAINING ZINC-FERROUS FERRITE CORE

[75] Inventors: Doeko Stoppels; Peter G. T. Boonen; Ulrich E. Enz; Leonardus A. H. van Hoof, all of Eindhoven, Netherlands

[73] Assignee: U.S. Philips Corporation, New York, N.Y.

[21] Appl. No.: 458,125

[22] Filed: Jan. 14, 1983

[30] Foreign Application Priority Data

Jan. 19, 1982 [NL] Netherlands .................. 8200174

[51] Int. Cl.$^4$ ............................................. G11B 5/127
[52] U.S. Cl. .................................................. 360/125
[58] Field of Search ....................... 360/110, 125, 127; 252/62.62

[56] References Cited

U.S. PATENT DOCUMENTS 3,027,327 3/1962 Blank ............................. 252/62.62
3,843,541 10/1974 Chiba ........................... 252/62.62 X

OTHER PUBLICATIONS

Chemical Abstracts, vol. 87, 1977, p. 566, Abst. #110612e, Nanadikar, N. G.; "Magnetic Relaxation Proc. in Zinc-Ferrous Ferrites".

Primary Examiner—A. J. Heinz
Attorney, Agent, or Firm—Joseph P. Abate

[57] ABSTRACT

A magnetic head for a magnetic recording and playback device includes a core having two core parts which are spaced from each other and between which a transducing gap is formed. The core consists of a (preferably monocrystalline) zinc-ferrous ferrite. A preferred range of compositions is defined by the formula $$Zn_a Fe_{1-a}{}^{II} Fe_2{}^{III} O_4, \text{ wherein } 0.1 \leq a \leq 0.4.$$

The Zn-ferrous ferrite may further comprise additions of $Co^{II}$.

6 Claims, 3 Drawing Figures

MAGNETIC HEAD HAVING COBALT-CONTAINING ZINC-FERROUS FERRITE CORE

BACKGROUND OF THE INVENTION

The invention relates to a magnetic head for a magnetic recording and playback apparatus, which head comprises a core of a spinel ferrite having two core parts which are spaced from each other and between which a transducing gap is formed.

It is known that the use of spinel ferrites, in particular Mn-Zn ferrites, as a magnetic core material of magnetic heads is desired for use in apparatus for magnetic tape recording and playback, such as audio and video tape recorders, because ferrites are available which have the advantages of a high resistance to detrition and very good magnetic properties, for example, with reference to magnetic saturation, coercive force and permeability, and good frequency characteristics.

Magnetic fields which are generated by a magnetic head at the area of the transducing gap to write information on a magnetic medium depend directly on the saturation magnetization of the material of the magnetic head core. Magnetic heads for present-day video recorders usually have a core of a Mn-Zn ferrite having a characteristic saturation magnetization $4\pi M_s$ of approximately 500 mT (5,000 Gauss) at room temperature. Their magnetization, also at temperatures slightly above room temperature, satisfies the requirements imposed by the recording of information on conventional tapes such as $CrO_2$ tape having a coercive force $H_c$ of approximately 56 k A/m (700 Oersted).

However, in order to improve the quality of the video recording process, there is a tendency to replace the conventional magnetic tapes by magnetic tapes having a high coercive force, for example, tapes on the basis of pure Fe, which have a $H_c$ of approximately 88–136 kA/m (1,100–1,700 Oersted). The use of such magnetic tapes implies that the materials of the magnetic core must have a larger $4\pi M_s$ value than the present-day ferrite materials. Such a material does exist but it has other properties which make it less suitable for the applications in view. This material, Sendust, an alloy consisting of approximately 85% by weight of Fe, 10% by weight of Si and 5% by weight of Al, has a saturation magnetisation $4\pi M_s$ which is considerably larger than 500 mT (5,000 Gauss). However, it has the disadvantage that, in contact with a moving magnetic tape, it is subject to a much higher detrition than ferrite. Moreover, Sendust has a resistivity of $10^{-6}\Omega$ m ($10^{-4}\Omega$ cm), which is three orders of magnitude smaller than that of, for example, monocrystalline Mn-Zn ferrites. Due to this low resistivity, the core of a video-Sendust head must be constructed from a number of thin laminations which are insulated from each other, which complicates production techniques.

SUMMARY OF THE INVENTION

It is the object of the invention to provide a core for a magnetic head which consists of a material which has a saturation magnetization sufficiently higher than 5,000 Gauss, and a resistance to detrition which is higher than the resistance to detrition of Sendust.

This object is achieved in that the magnetic head according to the invention has a core of a zinc-ferrous ferrite. This may be an unsubstituted zinc-ferrous-ferrite or a substituted zinc-ferrous-ferrite.

Zinc-ferrous ferrite (general chemical composition $Zn_aFe_{1-a}{}^{II}Fe_2{}^{III}O_4$) which is new for this application was not yet known to have a high value of the saturation magnetization, in particular in the composition range with $0 < a \leq 0.5$. The highest value of the saturation magnetization in the composition range $0.1 \leq a \leq 0.4$ at room temperature (20° C.) proves to be approximately 700 mT (7,000 Gauss), which is 40% larger than the value of 500 mT (5,000 Gauss) for the presently used Mn-Zn ferrites. Recording information on magnetic tapes having a coercive force of 112 kA/m (1,400 Oersted) seems possible with magnetic heads having cores of this material. Furthermore, because of their ferrite nature, zinc-ferrous ferrites have the same good detrition properties as the (Mn-Zn) ferrites used until now, and hence are considerably better in this respect than Sendust.

The resistivity of zinc-ferrous-ferrite appears to be approximately $10^{-4}\Omega$ m ($10^{-2}\Omega$ cm), which is two orders of magnitude higher than the resistivity of Sendust. Although the electric conductivity is considerably lower than that of Sendust, it is so large that, as a result of the occurrence of the skin-effect, it might be thought that it would restrict the applicability of Zn-ferrous ferrites for magnetic heads which are to write signals of video frequencies. It has been found, however, that with the dimensions of video heads as used nowadays this comparatively high conductivity does not present any problems. It has been found that with (unlaminated) head cores not thicker than 200 $\mu$m the transducing of signals with a frequency up to even 4.5 MHz (video frequency) does not present any problems.

A Zn-ferrous-ferrite single crystal is preferably used for the head core of the magnetic head in accordance with the invention.

Single crystals of this material can be grown in the same manner by means of the so-called "seeded" Bridgman technique as single crystals of Mn-Zn-ferrite.

BRIEF DESCRIPTION OF THE DRAWING

An embodiment of the invention will now be described with reference to the drawing, in which.

DESCRIPTION OF THE PREFERRED EMBODIMENTS

Figure 1:
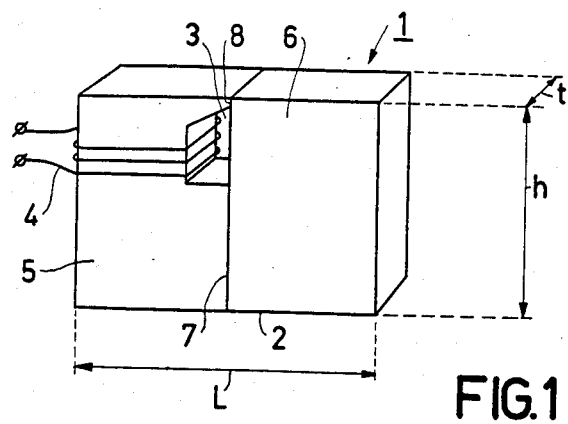
FIG. 1 is a diagrammatic perspective view of a magnetic head.

FIG. 1 shows a magnetic head 1 having a magnetic core 2. The magnetic core 2 has a winding aperture 3 through which a winding 4 is wound. The magnetic core 2 is formed from two monocrystalline wafers 5, 6 of zinc-ferrous-ferrite ($Zn_aFe_{1-a}{}^{II}Fe_2{}^{III}O_4$) which are bonded together by means of glass in the places 7, 8.

Figure 2:
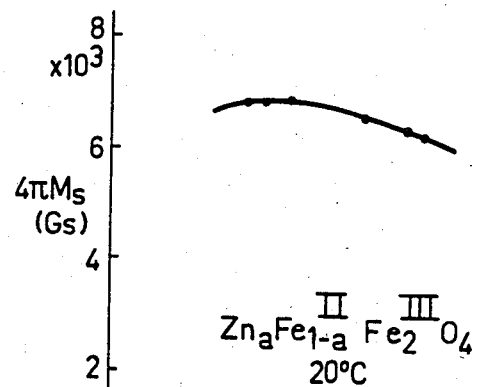
FIG. 2 is a graph showing the relation between the saturation magnetization $4\pi M_s$ (in Gauss) of a magnetic head of $Zn_aFe_{1-a}{}^{II}Fe_2{}^{III}O_4$ and the parameter a, and FIG. 3 is a graph showing the saturation magnetization $4\pi M_s$ (in Gauss) of two Zn-ferrous-ferrite materials of different compositions as a function of the temperature T (in degrees K.).

The saturation magnetization $4\pi M_s$ of $Zn_aFe_{1-a}{}^{II}Fe_2{}^{III}O_4$ ($0.1 \leq a \leq 0.4$) at 20° C. is between 600 and 700 mt (6,000 and 7,000 Gauss) (FIG. 2) and depends on the value of a. The $4\pi M_s$ values are measured by means of a vibrating sample magnetometer. The largest value measured was 693 mT (6,930 Gauss), which is the highest value for ferrites measured up to now. This value is 40% above the saturation magnetization of the conventional Mn-Zn ferrites used in magnetic heads.

Figure 3:
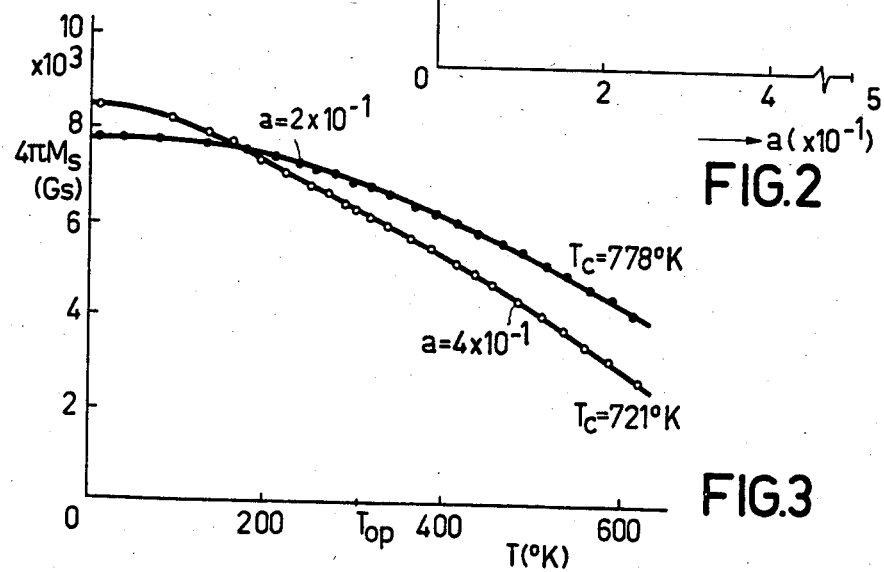

FIG. 3 shows the saturation magnetization $4\pi M_s$ (in Gauss) as a function of the temperature (in °K.) for two different Zn-ferrous-ferrite compositions (with a=0.2 and a=0.4, respectively). The Curie temperatures $T_c$ are also stated (778 K. and 721 K., respectively). These are considerably higher than those of conventional Mn-Zn ferrites (~500 K.). A further advantage of Zn-ferrous-ferrites is evident herefrom. As a result of magnetic losses and friction with the magnetic tape, the temperature of a magnetic head during operation rises to above ambient temperature, for example, to temperatures of approximately 300° to 310° K. (Indicated in FIG. 3 as $T_{op}$). The saturation magnetization of zinc-ferrous ferrites at these temperatures has decreased much less than that of Mn-Zn ferrites due to the high Curie temperature of the former.

It will be evident from the above that (polycrystalline or monocrystalline) zinc-ferrous-ferrites are suitable materials for magnetic heads which are used for writing on high coercive magnetic tapes. A writing head of zinc-ferrous ferrite may be combined with a reading head in the form of a magnetoresistive element, so that the zinc-ferrous-ferrite composition can be optimized for the writing mode. For providing a magnetic head having optimum writing characteristics, it is important for the zinc-ferrous-ferrite to have a sufficiently low coercive force. This can be achieved by substituting, in the zinc-ferrous-ferrite, a small quantity of cobalt ions (from 0.05% to 0.5% of the total metal ions concentration).

Characteristic dimensions for the magnetic head 1 of FIG. 1 are L=3 mm and h=3 mm. With a thickness dimension t of 200 μm or smaller, it has been found that a magnetic head of monocrystaline zinc-ferrous ferrite, in spite of a comparatively low resistivity, can be operated at frquencies of a few MHz without being deteriously affected by the skin effect. The resistivity of monocrystalline $Zn_{0.37}Fe_{2.63}O_4$ at 20° C. measured by means of the four-point method was $2\times10^{-4}\Omega$ m ($2\times10^{-2}\Omega$ cm), which is still two orders of magnitude higher than the resistivity of Sendust.

Single crystals of zinc-ferrous-ferrite were grown at a temperature of 1,650° C. by means of a "seeded" Bridgman technique in a platinum crucible in an oxygen-nitrogen mixture (volume ratio 1:17). The direction of growth was [100], the growth rate was 2 to 4 mm/h. Single crystals were obtained having a length of 50 mm and a diameter of 20 mm. For further details of the technique used see G.B. Patent Specification No. 2,084,483A.

What is claimed is:

1. A magnetic head comprising a magnetic core which includes two core parts forming a transducing gap, characterized in that each core part consists essentially of a cobalt-containing zinc-ferrous ferrite having a $Co^{II}$ content in a range from 0.05% to 0.5% of the total metal ion concentration.

2. A magnetic head as claimed in claim 1, characterized in that the ferrite is monocrystalline.

3. A magnet head as claimed in claim 2, characterized in that the magnetic core has a thickness which is not greater than 200 micrometers.

4. A magnetic head comprising a magnetic core which includes two core parts forming a transducing gap, characterized in that each core part consists essentially of a cobalt-containing zinc-ferrous ferrite having a composition defined by a formula $$Zn_aCo_b^{II}Fe_{1-a-b}^{II}Fe_2^{III}O_4,$$

wherein $0.1 \leq a \leq 0.4$ and $0.0015 \leq b \leq 0.015$.

5. A magnetic head as claimed in claim 4, characterized in that the ferrite is monocrystalline.

6. A magnetic head as claimed in claim 5, characterized in that the magnetic core has a thickness which is not greater than 200 micrometers.

* * * * *